United States Patent [19]
Kesel et al.

[11] 4,032,947
[45] June 28, 1977

[54] CONTROLLABLE CHARGE-COUPLED SEMICONDUCTOR DEVICE

[75] Inventors: Güenther Kesel; Reinhard Losehand, both of Munich, Germany

[73] Assignee: Siemens Aktiengesellschaft, Berlin & Munich, Germany

[22] Filed: Jan. 2, 1975

[21] Appl. No.: 538,124

Related U.S. Application Data

[63] Continuation of Ser. No. 297,338, Oct. 13, 1972, abandoned.

[30] Foreign Application Priority Data

Oct. 20, 1971  Germany .......................... 2152293

[52] U.S. Cl. .................................. 357/24; 357/23; 357/15; 357/45; 357/32
[51] Int. Cl.² ................. H01L 29/78; H01L 29/48; H01L 27/10; H01L 27/15
[58] Field of Search ................... 357/23, 15, 24, 45

[56] References Cited

UNITED STATES PATENTS

| | | | |
|---|---|---|---|
| 3,377,513 | 4/1968 | Ashby et al. | 357/24 |
| 3,435,445 | 3/1969 | Clendinning et al. | 357/24 |
| 3,720,922 | 3/1973 | Kosonocky | 357/24 |

*Primary Examiner*—Edward J. Wojciechowicz
*Attorney, Agent, or Firm*—Hill, Gross, Simpson, Van Santen, Steadman, Chiara & Simpson

[57] ABSTRACT

A charge-coupled device comprising a plurality of rows and columns of capacitively coupled electrodes are provided in which information can be read in by applying signals to certain of the electrodes and storing them in discrete individual elements of the matrix and wherein rapid read-out may be accomplished and wherein the stored charges need not be transferred through a long line or chain of charge-coupled elements. A three-axis embodiment provides for storage elements with three mutually coupled electrodes for receiving inputs and storing information which can be read out as desired.

12 Claims, 6 Drawing Figures

U.S. Patent  June 28, 1977  4,032,947
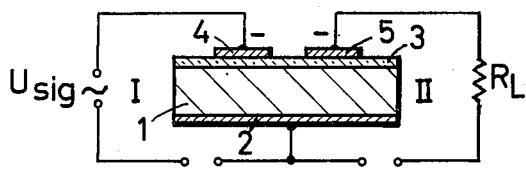
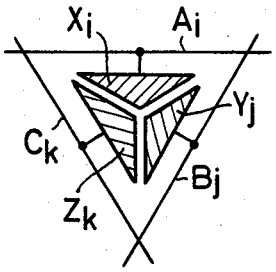
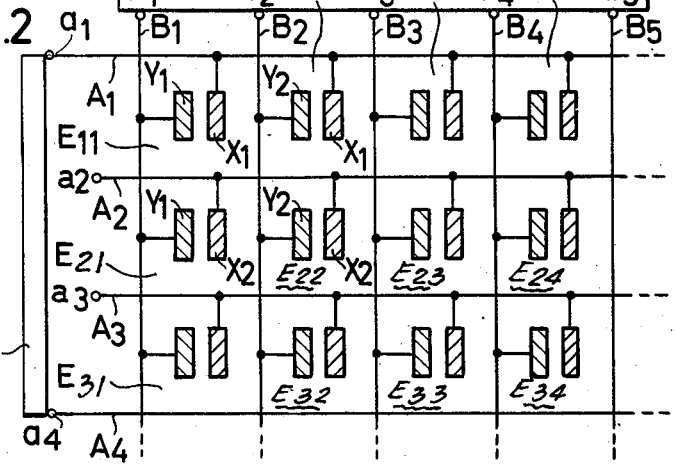
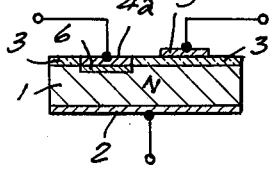
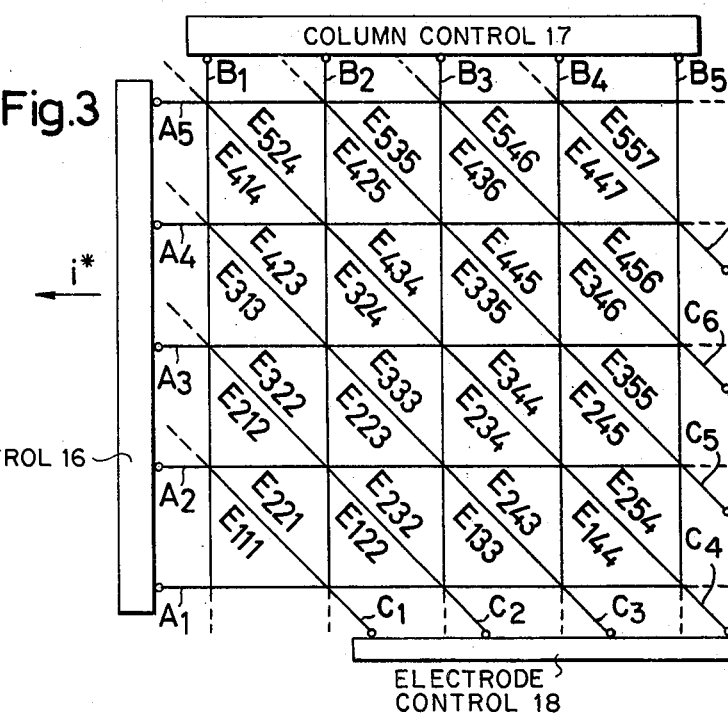
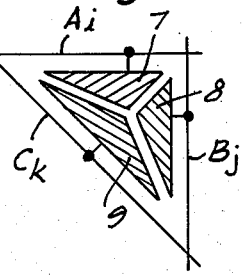

CONTROLLABLE CHARGE-COUPLED SEMICONDUCTOR DEVICE

This is a continuation of application Ser. No. 297,338 filed Oct. 13, 1972 now abandoned.

BACKGROUND OF THE INVENTION

1. Field of the Invention:

This invention relates in general to charge-coupled devices and to memories and in particular to a novel charge-coupled memory which has fast read-in and read-out time and which is capable of storing large quantities of information.

2. Description of the Prior Art:

Charge-coupled semiconductor devices are described in the Bell System Technical Journal of April 1970 at pages 587–600 by W. S. Boyle and G. E. Smith. The article appearing in Electronics of May 11, 1970 at pages 112–118 also describes such prior art devices. These devices primarily store minority carriers in a spatially defined depletion region and shift such stored charges linearly through the devices by phased input signals. Such devices comprise an insulating layer formed over a substrate of an N- or a P-type conductive monocrystalline material. The insulating material might, for example, comprise silicon-dioxide. A number of electrodes are arranged in a row and are supplied with different cyclically varying alternating voltage. The voltages are selected relative to the barrier-free electrode of the semiconductor member such that space charge zone in the form of so-called depletion layers will be produced in the semiconductor at the boundary with in insulating layer.

For a simple two-electrode arrangement, depletion zones will be produced directly adjacent to the insulating layer beneath the electrodes. The fixed space charges will be positive if the semiconductor substrate is N-type semiconductor material and will be negative if the substrate is P-type semiconductor material. The space charge zone thus depends on the concentration of doping in the semiconductor and on the magnitude of the applied voltages to the electrodes. Minority charge carriers produced in the semiconductor substrate will have the same sign as the space charge and will collect at the boundary surface beneath the insulating layer. It is possible to shift this movable charge consisting of minority charges from the area below one of the electrodes to under the area below the other electrode, or, vice-versa, by means of varying the potentials which are applied to the two electrodes. Such principle is used to switch charges in the prior art devices.

The prior art arrangements comprise a number of insulating electrodes arranged in a line or chain to form a two-dimensional diode raster. It is possible, due to corresponding potentials applied to the individual electrodes which periodically vary with respect to time, to shift a charge fed into the first electrode which can consist of minority charge carriers successively down the electrode chain to an output electrode at the other end of the chain. Such charge is gradually moved from electrode to electrode and finally appears as an output signal at the output electrode which feeds it to an output circuit for utilization and evaluation.

Thus, with charge-coupled devices of prior art, a relatively long transport chain must be traversed by the intelligence before it can be read out. This has the following drawbacks: First, since a certain percentage of the information is lost during each transport step from electrode to electrode, the length of the chain is limited due to the required signal-to-noise ratio of the output signal; second, with such devices it is not possible to individually read an individual element without changing the information content of the succeeding elements (It would be very advantageous to simultaneously read the output of all elements in such devices); third, the speed of reading a linear matrix of the prior art is very slow due to the required serial reading.

SUMMARY OF THE INVENTION

It is an object of the present invention to provide an improved charge-coupled matrix which eliminates the problems of the prior art.

In the present invention a plurality of charge-coupled devices are provided which are arranged in rows and columns with each charge-coupled device comprising a pair of electrodes formed over an insulating layer on one surface of a semiconductor substrate and separated from each other but close enough such that space charges can be transferred between them. The first associated electrodes in each column are connected together by a common lead and the second electrodes in each element are connected together by a common electrode associated with each row.

Thus a two-dimensional matrix is formed in which binary or other intelligence can be stored and read out at a very rapid rate.

BRIEF DESCRIPTION OF THE DRAWING

Other objects and features and advantages of the present invention will be readily apparent from the following description of certain preferred embodiments thereof taken in conjunction with the accompanying drawing although variations and modifications may be effected without departing from the spirit and scope of the novel concepts of the disclosure and in which:

FIG. 1 is a sectional view of a charge-coupled device;

FIG. 2 is a plan view of a first embodiment of the invention;

FIG. 3 is a plan view of a second embodiment of the invention;

FIG. 4 is an enlarged planar view of the embodiment illustrated in FIG. 3;

FIG. 5 is a sectional view of a modification of the invention; and

FIG. 6 is a plan view of the modification illustrated in FIG. 3.

DESCRIPTION OF THE PREFERRED EMBODIMENTS

FIG. 1 illustrates in sectional view a space charge device which has a semiconductor substrate 1 that might be N-type or P-type depending on the doping. The doping may be in the range from $10^{12}$ to $10^{16}$ donor atoms or acceptor atoms/cm.$^3$. The substrate 1 might be made of silicon or germanium or an $A_{III}B_V$-compound. A first electrode 2 is formed on one side thereof and an insulating layer 3 is formed on the other side of the substrate. The insulating layer might be silicon-dioxide, for example. A pair of electrodes of electrical conducting material 4 and 5 are formed on the insulating layer 3 adjacent each other. Each of these electrodes forms an electrical capacitor with the semiconductor member 1 wherein the insulating layer 3 serves as a di-electric and the semiconductor material 1 serves as a joint electrode for both capacitors. This results in electrical coupling of the current in circuit 1 into the circuit II due to its effect on the electrode 5. A suitable input signal $U_{stg}$ is applied to the device and load resistor $R_L$ is connected in the output circuit II.

During the operation of the arrangement of FIG. 1 a depletion zone will be produced adjacent the insulating layer 3 in the semiconductor material 1 due to the operational voltages which are applied to the electrodes 2, 4 and 5. Fixed space charges will be formed which are positive if the semiconductor material 1 is N-type and which are negative if the semiconductor material is P-type. The space charge zone therefore depends on the doping concentration of the semiconductor and on the magnitude of the applied voltages.

Minority charge carriers produced in the semiconductor member 1 will have the same charge sign as the spaced charge and will collect at the boundary surface with respect to the insulating layer 3. It is possible to shift this movable charge consisting of minority charges from the area below the electrode 4 into the area below the electrode 5 or vice-versa by controlling the potentials applied to the electrodes 4 and 5.

Prior art arrangements such as described in the Bell System Technical Journal, the article previously referenced, provides for an arrangement of a number of insulating electrodes formed in a row to which potentials are applied so as to shift a charge beneath the first of the electrodes in the row successively along the electrode chain to an output electrode. The charge in prior art devices of this type require that a relatively long transport chain must be traversed and since some information is lost during each transfer, the chain length is limited due to the required signal-to-noise ratio of the output signal. It is also, in prior art devices, not possible to read individual elements without changing the information content of the remaining elements. Also, the read speed of the matrix is slow due to the required serial reading.

In the present invention, pairs of electrodes are mounted on an insulating coating over a semiconductor substrate and corresponding electrodes of each pair are electrically connected together by column leads and corresponding ones of each element are connected together by row leads. Each element of the device includes at least one electrode which is separated from the semiconductor member by the insulating layer and each electrode of each group is connected to at least one other electrode of another group.

In the present invention, the insulating layer 3 over the semiconductor substrate 1 may support all of the insulated electrodes and the column and row conductors. Alternatively, it is possible that one of the electrodes of each of the memory elements may be coupled to the substrate with a P-N junction or a Schottky junction which is poled in the barrier direction. Such structure is illustrated in sectional view, for example, in FIG. 5 wherein this specific example illustrated the semiconductor material 1 is the N-type and is provided with a P-type region 6 adjacent the surface opposite the electrode 2. The insulating layer 3 formed over the surface of the semiconductor material 1 carries the electrode 5 and an opening is formed above the P-type region 6 on which the electrode $4_a$ is formed.

It is important in the operation of arrangements according to the invention that depletion zones produced in the semiconductor member 1 at the boundary between the insulating layer and the semiconductor layer below each of the individual electrodes that the space charges representing depletion zones does not contain any minority charge carriers after the application of corresponding operational voltages. The voltages applied between electrode 2 and the insulating electrodes are poled such that minority charge carrier are attracted by the insulating electrodes. Under such circumstances space charge zones will be produced in the semiconductor 1 below the insulating electrodes in the form of depletion zones of majority charged carriers in a manner similar to that formed in a P-N junction poled in the barrier direction. The depth of the space charge zones increases when the value of the voltage applied between the semiconductor 1 and the respective insulating electrode is increasing.

If charge carriers are produced in such space charge zones, as for example, by exposing the semiconductor material 1 to light, then minority charge carriers will be attracted in the direction of the insulated electrode and will thus collect at the boundary of the semiconductor member 1 with respect to the insulating layer 3. Thus the minority charged carriers will move into the region below the respective electrode when a voltage is applied only to such respective electrode, or, when the potentials of all of the insulating electrodes have the same value. Due to the presence of minority carriers at the boundary between the insulating layer and the semiconductor material 1, the potential distribution will change within the semiconductor member and the depth of the space charge will decrease. The number of minority charge carriers can only increase up to a certain boundary value, however, which is determined by the doping conditions in the semiconductor material 1. Thus, a charge can be stored only up to a certain saturation value with a particular given electrode arrangement which depends upon geometry and spacing of the electrodes.

The distance between the electrodes should not be great with an arrangement according to the invention and should be kept at a minimum so as to obtain rapid speed and desirable operation of the arrangement.

The distance is determined from the equation $$W = (U \cdot \epsilon_h / N \cdot e)^{1/2}$$

when W is the distance between electrodes, U is the distance of the Fermi level from the lowest band edge with a P-type semiconductor material, $\epsilon_h$ is the dielectric constant of the semiconductor material, N is equal to $|N_D - _A|$ equals the net concentration of the doping atoms and e equals $1.6 \times 10^{-19}$ coulombs.

Good results in actual devices have been obtained with minimum spacing in the range of 0.2 through 2 $\mu$m between the electrodes within an electrode group. The closest distance between an electrode of an electrode group with an arrangement according to the invention should not, if possible, exceed the value of 10 $\mu$m.

A particular practical embodiment of the invention provides that charge-coupled elements each consisting of a pair of electrodes formed on the insulating layer 3 are arranged in a plurality of rows and columns as shown in plan view in FIG. 2 and with first electrodes $Y_1$ of each elememt connected by a first column electrode lead $B_1$ with an input terminal $b_1$. Other column electrodes $B_2$, $B_3$, $B_4$, etc., are respectively connected to the first electrodes in each column of the elements. For example, lead $B_2$ is connected to the first electrode $Y_2$ of each of the elements in the second column.

The second electrodes $X_1$ in each of the rows are connected to a common row lead $A_1$ which has an input terminal $a_1$ as shown in FIG. 2. Likewise, each of the second electrodes $X_2$ in the second row are connected to a commmon row lead $A_2$ which has input terminal $a_2$, as shown. In the matrix illustrated in FIG. 2, each of the elements may be identified by the column and row in which they are placed. For example, the first element $E_{11}$ is in the first row and the first column. The element immediately below it is identified as $E_{21}$ and is in the second row and the first column. The third element $E_{31}$ is in the third row and the first column. The element $E_{12}$ is in the first row and the second column. The element $E_{13}$ is in the first row and the third column, etc. For example, the element $E_{34}$ is in the third row and the fourth column.

The important development according to the present invention provides that the element $E_{ij}$ formed of coupled electrodes $X_i$ and $Y_j$ are arranged in rows and columns of a matrix and mounted on the same side of a semiconductor member as, for example, a substrate such that at least one electrode of each of the elements $E_{ij}$ is separated from the substrate by an insulating layer which covers the semiconductor member. Further, the insulating layer carries a plurality of conductor paths $A_i$ and $B_j$ which extend parallel to the rows $i$ and the columns $j$ of the matrix and form the element $E_{ij}$. The conductive paths are insulated from each other including their crossing points as shown in FIG. 2. Thus the matrix of FIG. 2 is formed on top of an insulating layer as, for example, an $SiO_2$ layer. The thickness of the insulating layer 3 should be such that the layer cannot be tunneled through by the charge carriers to an appreciable extent, however, if the insulating layer 3 is maintained relatively thin, good control and high saturation capacity is obtained. Good results have been obtained wherein the insulating layer 3 was in the range between 50 nm. and 5,000 nm. The preferred thickness of the insulating layer 3 is between 100 nm. and 1,000 nm. It is to be realized, of course, that the same effect of a single insulating layer 3 can be obtained by utilizing several superposed layers of insulation. However, generally, a continuous covering of the semiconductor surface 1 by an insulating layer 3 is preferred.

The electrodes Y and X of the element $E_{ij}$ are formed on the insulating layer 3 as shown in FIG. 2 with the conductors A and B as shown in rows and columns with insulation between the crossing of the various leads A and B. Input terminals are designated as $a_i$ and $b_i$, respectively.

If the matrix illustrated in FIG. 2 is to be utilized as an optical fixed body memory, provisions will be made for the optical production of minority charge carries. In addition to the optical means required for the selective exposure of the matrix, the access to the depletion region below the insulated electrodes will be rendered responsive to radiation from the optical means. For example, insulating layer 3 may be made transparent or semitransparent and the electrodes X and Y may be made small or transparent or perforated so that light energy can pass therethrough. Alternatively, light energy may be applied to the semiconductor substrate 1 from the side on which the electrode 2 is mounted and the semiconductor substrate 1 will be constructed so that it is not too thick to allow light energy to affect the regions beneath the electrodes X and Y. In such embodiment, the electrode 2 may contact the edge of a ring-shaped strip mounted on the rear surface of the semiconductor 1 and the rear surface would not be metallized so as to render it transparent. The completed device may be covered by a further protective layer which insulates but which is at least partially transparent. The electrical contact points $a_i$ and $b_j$ will, of course, be left free of insulation, and they may be at least partially optically transparent.

The charge stored beneath the electrodes X and Y increases as a function of time until a saturation value has been obtained in the balanced state. For this reason, the entire charge must be erased from time to time so as to obtain the initial state. Erasure may be accomplished by (a) erasure by means of attracting stored minority charge carriers with an electrode provided with each electrode group and which contacts the semiconductor 1 with a P-N junction or Schottky junction and mounted close to the other insulated electrodes in a manner such that minority charge carriers stored in the depletion zone of the insulated electrodes can pass into the zone adjacent the electrode formed with the P-N or Schottky junction. If a direct or alternating voltage is applied between the individual electrodes of the groups, minority charge carries will be driven to the P-N junction or the Schottky junction at least temporarily and will be irreversibly withdrawn from the area of the depletion zones.

b. Another method of erasing is to provide for a recombination of stored shiftable minority charge carriers and to obtain such erasure all of the electrodes are brought to the same potential by short circuiting means.

There are a number of applications for the use of a matrix circuit constructed of the element $E_{ij}$ shown in FIG. 2 as, for example, the element may be used to operate as an optical converter wherein optical information is converted into electrical information similar in the manner in which Vidicon tubes are used.

In a particular embodiment, one of the electrodes as, for example, the electrode $Y_j$ of each of the elements $E_{ij}$ may be connected to the semiconductor material 1 through a P-N junction as illustrated in FIG. 5. The other electrode $X_i$ is mounted over the insulating layer 3.

The row conductor path $A_i$ will have the potential $P_i$ and the column conductor path $B_j$ will have the potential of $\Pi j$. The condition $$P_i - \Pi_j > 2 Q/C$$

is to be maintained for all of the electrodes $X_i$ and $Y_j$. Q is the stored charge and C the capacitance of the insulated electrode $X_i$ with respect to the space charge-free portion of the semiconductor member 1. The stored charge of each of the elements will be positioned respectively below the electrode $X_i$ of each of the elements $E_{ij}$ of the matrix shown in FIG. 2. If the potential $P_i$ of the $i$th row is decreased by the amount of $Q/C$ and the potential $\Pi_j$ of the $j$th column is increased by the same amount, these two potentials $P_i$ and $\Pi_j$ will be equal at one of the elements $E_{ij}$. At all of the other elements $E_{kl}$ of the matrix ($k \neq i$ and $l \neq j$) $P_k - \Pi_l$ will be greater than Q/C. This means that the storage charge Q is moved from the electrode X to the electrode Y only at the element $E_{ij}$. If the electrode $Y_j$ is an electrode with a barrier blocked P-N junction or Schottky junction, an erasure will simultaneously take place which will cause a current impulse at the electrode $Y_j$. With all of the other elements $E_{kl}$ of the matrix stored charges will remain in the semiconductor region below the electrodes X as contrast to the element $E_{ij}$.

A row control 12 is connected to terminals $a_1$–$a_n$ and a column control 13 is connected to terminals $b_1$–$b_n$.

Controls 12 and 13 selectively supply voltages and detect current from terminals $a$ and $b$.

Reading or interrogation of the matrix of FIG. 2 can be accomplished in the following manner:

1. Basic state of all elements for the matrix $P_i - \Pi_j > 2 Q/C$;
2. Increase the potential of the first row by $Q/C$;
3. Lower the potential $\Pi_1$ of the first matrix column by an amount $Q/C$. A current pulse $I_{11}$ will be produced in column 1;
4. Lowering the potential $\Pi_2$ of the second column conductor path $B_2$ by $Q/C$. A current pulse $I_{12}$ will be produced corresponding to the state of the element $E_{12}$;
5. Lowering the potential $\Pi_3$ of the conductor path $B_3$ of the third matrix column by $Q/C$. A current pulse $I_{13}$ will be produced corresponding to the charge state of the element $E_{13}$.

By means of successively lowering the potential $\Pi_j$ of the diode columns starting at 1, the charge state of all of the elements $E_{ij}$ of the first matrix row will be interrogated. The impulses $I_{ij}$ are taken at the terminal $b_j$ of the column conductor paths $B_j$.

In order to interrogate the elements of the rows, for example, the second, third ... $m$ row, the potential $P_i$ of the particular row, for example, $P_2, P_3 \ldots P_m$, is given the value of $Q/C$ and then the charges stored in the elements $E_{ij}$ of the matrix row are read by means of successively lowering the column potentials $\Pi_j$. The rows may be successively read advantageously.

To interrogate all of the elements $E_{ij}$ of the matrix requires a cycle time of $T_z$. Thus the time $T_z$ can be used for charge storage. In other words, the minority charge carriers which might be produced for example by exposure of the semiconductor to light energy to charge each of the elements $E_{ij}$. The time to interrogate each of the elements $E_{ij}$ is $$T_o = T_z/m \cdot n$$

where $m$ is the number of rows and $n$ is the number of columns of the matrix. The signal current $I_j$ of the individual element $E_{ij}$ is $$I_{ij} = T_z \cdot \eta \cdot \Lambda_{ij}/T_o$$

where $\eta$ is the photoelectric efficiency, $\Lambda_{ij}$ is the radiation power impinging on element $E_{ij}$. The total current for all of the elements, of course, will be the individual current multiplied by $m \cdot n$.

The average current for the entire matrix is equal to $\bar{I} = \eta \cdot \bar{\Lambda}$ ($\bar{\Lambda}$ is the average or mean radiation intensity received by the elements). This equation shows that the mean signal current for the entire matrix is proportional to the mean production rate in the matrix of the charge carriers.

This method of reading elements $E_{ij}$ in a matrix wherein each element has one electrode comprising a P-N or Schottky junction is similar to the manner in which reading is accomplished in a Vidicon camera tube operated in the light integration mode. The matrix of the present invention is compatible with common television technique. The short circuit capacitance of the matrix is essentially the capacitance of a row or column and can be maintained as low as several pF. It is thus in the same order of magnitude as that of Vidicon camera tubes.

It is also possible with the matrix of this invention to simultaneously interrogate all elements of a row (or a column) if the initial state of the applied potentials $P_i$ and $\Pi_j$ is selected such that $P_i - \Pi_j > Q/C$. When the potential $P_i$ of the $i$ row is lowered by an amount $Q/C$, the charge of each element of the row $i$ can be interrogated at the conductive path $B_j$ of the corresponding column $j$. Thus the interrogation speed can be substantially increased.

The operation of the second embodiment will be described. Such embodiment is constructed such that both the electrodes $X_i$ and $Y_j$ are separated from the semiconductor member 1 by the insulating layer 3.

The main difference between the operation of such an arrangement and that described above is that the memory charge $Q$ is not automatically erased in the individual elements $E_{ij}$ during interrogation. It is possible for the charge to move back and forth between the electrodes $X_i$ and $Y_j$ of an element for several times during read time, assuming that the boundary frequency $\tau^{-1}$ of the elements $E_{ij}$ is sufficiently large. This condition exists if an alternating current voltage $\Pi_j = \Pi_o \cdot \sin\omega t$ is applied at column $j$. Under these conditions, the following signal current will result in the individual elements:

If
$$\omega/2\pi << \tau^{-1},$$

then
$$I_{ij} = \omega \cdot T_z \cdot \eta \cdot \Lambda_{ij}/\pi,$$

if
$$\omega/2\pi >> \tau^{-1},$$

then
$$I_{ij} = 2\Pi_{ij} \cdot \mu_o \cdot T_z \cdot \Lambda_{ij}\pi \cdot 1^2.$$

Where $\omega$ is the circular frequency of the applied alternating current, $e$ is equal to the electric elementary charge, $\mu_o$ is the movability of the minority carriers, 1 is the distance between the center points between electrodes $X_{ij}$ and $Y_{ij}$.

Thus, alternating current amplification will occur which is independent of the interrogation mode and the elementary number of the matrix. The addressing of individual elements in the matrix can be effected in the following manner:

All column and row conductor paths are supplied the same potential relative to the electrode 2. By means of superposing the column potentials with the alternating voltage potential the memory charge will be transported in the elements $E_{ij}$ when $Q/C$ is exceeded by the potential $\Pi_j$. The corresponding signal current $I_{ij}$ will appear on the respective row conductor path $A_{ij}$. As long as the depletion zones of the individual elements $E_{ij}$ are maintained, storage charges $Q_{ij}$ will also be maintained. If the amount of the alternating voltage is increased after the read process by such an amount an enriched zone of majority charge carriers will be obtained in each element $E_{ij}$ of the $j$ matrix column temporarily during each period instead of a depletion zone of majority carriers below the electrodes $Y_j$ of the respective column. Then recombination will be effected as described before by means of reversing the surface state and thus erasure of the charges respectively stored in the elements $E^{ij}$ of the respective matrix columns will occur.

A possibility of reading simultaneously all elements of a matrix according to FIG. 2 exists when the alternating voltage has a frequency that changes from column to column and the signal currents $I_{ij}$ are filtered out at the row outputs $a_i$ by means of band filters.

The matrices of the present invention should have a minimum coupling between conductors, particularly at their cross points. This can be obtained, for instance, when at least one of the potentials $P_i$ or $\Pi_j$ is supplied through leads of low resistance.

A modification of the invention is illustrated in FIGS. 3, 4 and 6 wherein a matrix utilizing three groups of insulating electrodes $X_i$, $Y_j$ and $Z_k$ for each of the elements $E_{ijk}$ are provided. Each of the electrodes $X_i$ are connected by parallel conductor paths $A_i$. Each of the electrodes $Y_j$ are associated with conductive paths $B_j$ and each of the electrodes $Z_k$ are associated with conductive paths $C_k$ as shown in FIGS. 3, 4 and 6. FIG. 3, for example, illustrates in plan view a plurality of parallel conductors $A_1$–$A_5$. A second plurality of conductors $B_1$–$B_5$ are mounted at right angles to conductors $A_1$–$A_5$. A third group of conductive paths $C_1$–$C_7$ are mounted parallel to each other and at an angle with the conductive paths $A_i$ and $B_j$. A row control 16 is connected to conductors $A_1$–$A_5$. A column control 17 is connected to the conductive paths $B_1$–$B_5$. An electrode control 18 is connected to the conductive paths $C_1$–$C_7$. The controls 16, 17, and 18 provide suitable voltages to the electrodes X, Y, and Z and detect currents from the electrode triples. The conductive paths A, B and C may be mounted on an insulating layer over a semiconductor substrate 1 as in the embodiment of FIGS. 1 and 2, for example. As shown in FIG. 4, electrodes X, Y and Z may be formed of generally triangular shape with the electrodes X connected to conductors A, the electrodes Y connected to conductors B and electrodes Z connected to conductors C. Such structures form elements $E_{ijk}$, illustrated respectively in FIGS. 4 and 6. The difference between the elements in FIGS. 4 and 6, is that in FIG. 4 the conductors A, B and C cross at 60° angles whereas in the embodiment of FIG. 6, the conductors A and B cross at right angles and the conductor C crosses the conductors A and B at 45° angles. It is to be realized, of course, in both cases that the conductors are insulated when they cross.

Relative to FIG. 3, it is to be noted that 32 elements are shown in the particular embodiment and as shown in FIG. 6, each of the elements, as for example, like the element $E_{221}$ includes an electrode, as for example, in element $E_{221}$ an electrode 7 which is connected to the lead $A_2$ and electrode 8 which is connected to the conductor $B_2$ and an electrode 9 which is connected to the conductor $C_1$. Each of the elements is identified by its connections to the A, B and C conductors. For example, $E_{546}$ has its electrode 7 connected to conductor $A_5$, its electrode 8 connected to the conductor $B_4$ and its element 9 connected to the conductor $C_6$.

It is to be particularly noted that in the embodiments of FIGS. 3, 4 and 6 that all of the elements such as X, Y and Z in FIG. 4 and elements 7, 8 and 9 in FIG. 6, mutually interact due to the coupling through the insulating layer 3 and the substrate 1. Although in the example of FIG. 3 there are illustrated five conductors A and five conductors B and seven conductors C, it is to be realized that the same number of conductor paths A, B and C can be provided. The conductor paths $A_i$, $B_j$ and $C_k$ can be mounted on the insulating layer 3 as in the embodiment of FIGS. 1 and 2 and care should be taken that partially insulating layers are between the conductive paths at the cross-over points. It is also to be realized that matrices can be constructed which have more than three groups of conductor paths and insulating electrodes.

The presence of a third electrode in the embodiments of FIGS. 3, 4 and 6 and a third potential which influences the stored charge controls the transport process in the individual elements $E_{ijk}$ due to the additional electrical fields. The arrangement of FIGS. 3, 4 and 6 can be used, for example, in a manner similar to a three-pole magnetic memory matrix. The present device can also be influenced optically to convert light energy into electrical output.

The arrangement illustrated in FIG. 3 or FIGS. 4 and 6, operates such that the single elements can be controlled via three different conductor systems. The elements according to FIG. 1 can be operated such that the first electrode of the respective single element is used as a control electrode relative to the second electrode and vice versa. The three-electrode arrangement permits the first electrode to operate in view of the two others as a control electrode, while either of the second and the third electrodes are controlled in parallel. Also the first electrode can control the second electrode and then the second electrode controls the third electrode. If two electrodes receive the same low voltage, but the third electrode receives a high bias, the element then acts as an "AND-circuit". On the other hand, if the same initial potential is applied to all three electrodes, the element then acts as an "OR-circuit".

Although in the present invention the various electrodes of corresponding rows and columns are connected electrically together by conductive paths formed on the insulating layer 3 over the substrate 1, it is to be realized that such connection can be made with external conductors which are external of the semiconductor body.

Also, instead of utilizing optical energy for producing the stored charges, such charges can be produced by injecting charges with electrodes which contact the semiconductor material. For example, one of the insulating electrodes of each electrode group could be temporarily poled in the flow direction in a defined manner so that minority charge carriers are injected. For instance, the electrodes $Y_j$ in the form of P-N junction electrodes could be used for injecting minority carriers.

Simultaneously, the other insulated electrodes, for example, the electrodes $X_i$, may be supplied with a voltage such that a depletion zone is formed. The minority carriers produced in this manner are moved into the depletion zone by electrodes $X_i$. Then the injected electrode $Y_j$ of each group is re-poled in the barrier direction. The three electrode elements, as for example illustrated in FIGS. 3, 4 and 6, could advantageously be used for this purpose wherein the electrodes $Z_k$ are utilized to produce the minority charge carriers. The other two electrode systems $X_i$ and $Y_j$ could be used to evaluate the minority carriers.

Even in the case where the electrodes are separated from the semiconductor by the insulating layer, they are poled such that depletion zones are produced below them and capacitive coupling will allow influence to exist between the various electrodes.

It is seen that this invention provides charge coupled device of new form which can be used for converting visible light into electrical energy and/or as a memory and although it has been described with respect to preferred embodiments, it is not to be so limited as changes and modifications may be made therein which are within the full intended scope as defined by the appended claims.

What we claim is:

1. A semiconductor arrangement comprising a planarshaped n- or p- type semiconductor substrate, a first electrode contacting the semiconductor substrate blocking-free on one side thereof, a layer of silicon dioxide not greater than 5000 nm thick covering the other side of said semiconductor substrate, a system of straight-line running electrical conductor paths insulated from each other electrically and defining at least two sets of which divide the surface of the $SiO_2$ layer into a net-like pattern, a plurality of electrodes coupled electrically to the semiconductor substrate capacitively and arranged on said silicon dioxide layer and arranged into electrode groups, and each adjoining electrode group is separated by electrode-free regions respectively, and in which all electrode groups are similar to each other, and the shortest distance "W" between each of the two electrodes within each individual group is not greater than:

$$W = (U \cdot \epsilon_H / N \cdot e)^{1/2}$$

where, ($\epsilon_H$ = dielectricity constant of the semiconductor, $U$ = distance of the Fermi level from the lower band edge in an n-conducting semiconductor, or the upper band edge in a p-conducting semiconductor, respectively, $N$ = net concentration of the doping atoms, and $e = 1.6 \times 10^{-19}$ Coulomb), and wherein all electrode groups are arranged in pairs in the same fashion on one grid element of the matrix formed by said straight line electrical conductor paths on said silicon dioxide layer, and the individual electrodes of each individual group are electrically connected on one grid element at a time which forms the conducting path pattern in such a way, that in no electrode group two electrodes are connected to the same conductor path pattern and no two conductor paths are connected with the same electrode and at least a pair of controls wherein each conductor path, and each electrode of each electrode group can be individually addressed when said pair of controls supply voltages and detect current from said electrodes.

2. A controllable semiconductor arrangement according to patent claim 1 wherein said first and second plurality of conductor paths are mounted on said insulating layer in lines and columns of a rectangular matrix, and that in each one of the congruent rectangular meshes of the electrode formed thereby in mounted one electrode group consisting of two electrodes, and wherein each first one electrode of all said electrode groups associated with one row of the matrix are connected to the same one of said first plurality of electrical conductors and the other electrode of the electrode groups associated with each column of the matrix are connected to the same one of said second plurality of electrical conductors.

3. A device according to claim 1 wherein said pair of controls produce minority charge carriers under at least one electrode of each electrode element and remove a current impulse therefrom by said first plurality of electrical paths and said second plurality of electrical paths when a maximum of potential when said semiconductor member is N-type or a minimum of potential when said semiconductor member is P-type exists relative to the potentials of the other electrodes of said elements.

4. A device according to claim 1 wherein the spacing between said electrode pairs does not exceed a distance of 10 $\mu$m.

5. A device according to claim 1 wherein an optical information source furnishes radiant energy to said semiconductor member to produce charges therein below said insulating layer under said electrodes.

6. A device according to claim 3 wherein the stored charge is erased from time to time by shorting all of said electrodes of said elements together so as to bring them to the same electrical potential.

7. A device according to claim 1 wherein said pair of controls apply a direct or alternate voltage between the individual electrodes of each element such that the particular minority charge carriers are moved to said junctions of the individual electrode elements and are caused to recombine in the semiconductor member.

8. A semiconductor arrangement comparising a planarshaped n- or p- type semiconductor substrate, a first electrode contacting the semiconductor substrate blocking-free on one side thereof, a layer of silicon dioxide not greater than 5000 nm thick covering the other side of said semiconductor substrate, a system of straight-line running electrical conductor paths insulated from each other electrically and defining at least three sets of which divide the surface of the silicon dioxide layer into a net-like pattern, a plurality of electrodes coupled electrically to the semiconductor substrate capacitively and arranged on said silicon dioxide layer and arranged into electrode groups, and each adjoining electrode group is separated by electrode-free regions respectively, and in which all electrode groups are similar to each other, and the shortest distance "W" between each of any two electrodes within each individual group is not greater than:

$$W = (U \cdot \epsilon_H / N \cdot e)^{1/2}$$

where, ($\epsilon_H$ = dielectricity constant of the semiconductor, $U$ = distance of the Fermi level from the lower band edge in an n-conducting semiconductor, or the upper band edge in a p-conducting semiconductor, respectively, $N$ = net concentration of the doping atoms, and $e = 1.6 \times 10^{-19}$ Coulomb), and wherein all electrode groups are arranged in triplets in the same fashion on one grid element of the matrix formed by said straight line electrical conductor paths on said silicon dioxide layer, and the individual electrodes of each individual group are electrically connected on one grid element at a time which forms the conducting path pattern in such a way, that in no electrode group two electrodes are connected to the same conductor path pattern and no two conductor paths are connected with the same electrode and at least three controls wherein each conductor path, and each electrode of each electrode group can be individually addressed when said three controls supply voltages and detect current from said electrodes.

9. A device according to claim 8 wherein said first, second, and third plurality of electrical paths are arranged upon the insulating layer covering said semiconductor member to form a network of congruent triangles such as isosels or equilateral triangles.

10. A controllable semiconductor arrangement with a planar substrate of semiconductor material of one conductivity type, comprising a first electrode contacting said substrate in a blocking free manner on one surface thereof, a layer of silicon dioxide on the opposite side of said substrate, a first plurality of additional electrodes mounted on said layer of silicon dioxide, a first plurality of electrical conductors mounted on said layer of silicon dioxide and extending generally parallel in a first direction and insulated with respect to each other and with respect to the semiconductor substrate, said substrate electrically connected to said first electrode, said first plurality of additional electrodes divided into equal electrode groups with at least one of said additional electrodes insulated from said semiconductor substrate, a plurality of regions of second conductivity type formed in said semiconductor substrate and another of said plurality of additional electrodes of each group mounted on said regions of second conductivity type, and each electrode group separated with respect to the adjacent electrode groups by a distance which is greater than the distances between the individual electrodes within the groups, and each group divided by at least one of said first plurality of electrical conductors which pass between each two adjacent electrode groups, and in each of said electrode groups at least a first one of said plurality of additional electrodes connected to one of said first plurality of electrical conductors which separate the respective electrode group from the adjacent electrode groups, and the corresponding electrodes of immediately adjacent aligned electrode groups connected to said one of said first plurality of electrical conductors, and each of said first plurality of electrical conductors connected to common output points for supplying output signals, a second plurality of electrical conductors mounted on said layer of silicon dioxide and extending generally parallel in a second direction, a second one of each electrodes in said electrode groups connected to one of said second plurality of electrical conductors and the corresponding second electrode of immediately adjacent electrode groups also connected to said one of said second plurality of electrical conductors, and each of said second plurality of electrical conductors receiving the application of input control voltages.

11. A controllable semiconductor device comprising a planar semiconductor substrate of a first conducting type, a first electrode contacting blocking free one side of said planar substrate, an insulating layer of silicon dioxide which serves as a carrier on $m \cdot n$ electrode pairs formed on a second side of said planar substrate and said electrode pairs formed uniform to each other and arranged on the insulating layer close to each other such that capacitive influence of one of the electrodes to the other electrode of all of the electrode pairs exists via said other electrode of the same electrode pair via the insulating layer and the semiconductor substrate and wherein between electrodes, which belong to different electrode pairs, a noticeable capacitive influence does not exist due to larger spacing between such electrodes, whereby a system of $m \cdot n$ straight and mutually insulated electrical conductor paths is provided on said insulating layer so that $m$ of these conductor paths are parallel to each other and extend in a first direction and $n$ of these conductor paths are parallel to each other and extend in a second direction at right angles to said $m$ conductor paths so as to form on the insulating layer a lattice with insulated crossing conductor paths, said conductor paths sub-divided into island-like zones, said zones being bordered by four of said conductor paths, each one of said electrode pairs arranged in the inside of each one of said island-like zones, and whereby said one electrode of each electrode pair is electrically connected to one of said conductor paths which define the boundary of the zone, said zone containing the respective other electrode pair which is connected to a different conductive path such that each electrode has a conductive connection with only one conductor path, said two electrodes of each of the electrode pairs not having a conductive connection with the other two conductor paths forming said zone, and parts of a conductor path which extends between two adjoining electrode pairs has a conductive connection only with one single electrode of the four electrodes of adjoining two electrode pairs and a pair of controls respectively connected to said $m$ and $n$ conductor paths to supply voltages and detect current from said electrode pairs.

12. A controllable semiconductor device comprising a planar substrate of a first conductive type, a first electrode contacting blocking free one side of said planar substrate, an insulating layer of silicon dioxide which serves as a carrier of $m \cdot n$ individual electrodes formed on a second side of said substrate, and the electrodes of said electrode pairs arranged so close to each other that a noticeable capacitive influence of the first electrode of all of the electrode pairs to the other electrode of the same electrode pair exists via the insulating layer and the semiconductor substrate and wherein between electrodes, which belong to different electrode pairs, a noticeable capacitive influence does not exist due to larger spacing between such electrodes, whereby a system of $m \cdot n$ straight and mutually insulated electrical conductor paths is provided on said insulating layer so that $m$ of these conductor paths are parallel to each other and extend in a first direction and $n$ of these conductor paths are parallel to each other and extend in a second direction at right angles to said $m$ conductor paths so as to form on the insulating layer a lattice with insulated crossing conductor paths, and conductor paths sub-divided into island-like zones, said zones being bordered by four of said conductor paths, each one of said electrode pairs arranged in the inside of each one of said island-like zones, and whereby said one electrode of each electrode pair is electrically connected to one of said conductor paths which define the boundary of the zone, said zone containing the respective other electrode pair which is connected to a different conductive path such that each electrode has a conductive connection with only one conductor path, said two electrodes of each of the electrode pairs not having a conductive connection with the other two conductor paths forming said zone, and parts of a conductor path which extends between two adjoining electrode pairs has a conductive connection only with one single electrode of the four electrodes of adjoining two electrode pairs and a pair of controls respectively connected to said $m$ and $n$ conductor paths to supply voltages and detect current from said electrode pairs.

* * * * *